(12) United States Patent
Kanemoto

(10) Patent No.: US 7,452,781 B2
(45) Date of Patent: Nov. 18, 2008

(54) METHOD FOR MANUFACTURING A SEMICONDUCTOR SUBSTRATE, METHOD FOR MANUFACTURING A SEMICONDUCTOR DEVICE, AND THE SEMICONDUCTOR DEVICE

(75) Inventor: Kei Kanemoto, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 190 days.

(21) Appl. No.: 11/638,962

(22) Filed: Dec. 14, 2006

(65) Prior Publication Data
US 2007/0148832 A1    Jun. 28, 2007

(30) Foreign Application Priority Data
Dec. 27, 2005    (JP)    ............... 2005-374474

(51) Int. Cl.
*H01L 21/311*    (2006.01)
(52) U.S. Cl. .................. 438/311; 438/404; 257/347; 257/E21.32; 257/E27.112
(58) Field of Classification Search ............... 438/149, 438/295, 297, 311, 404, 479, 967; 257/347, 257/354, E21.32, E27.112
See application file for complete search history.

(56) References Cited

U.S. PATENT DOCUMENTS 7,008,701 B2 *    3/2006    Notsu et al. .................. 428/641

FOREIGN PATENT DOCUMENTS

| JP | 2006-100681 A | 4/2006 |
| JP | 2006-108206 A | 4/2006 |
| JP | 2006-210683 A | 8/2006 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner*—Quoc D Hoang
(74) *Attorney, Agent, or Firm*—AdvantEdge Law Group, LLC

(57) ABSTRACT

A method for manufacturing a semiconductor substrate having a silicon-on-insulator (SOI) structure region isolated by a local oxidation of silicon (LOCOS) film and an SOI structure in the region includes forming the LOCOS film so as to make a height from an uppermost surface of a semiconductor member to a top surface of the LOCOS film be higher than a height from the uppermost surface of the semiconductor member to a top surface of the SOI structure, forming a silicon germanium layer and a silicon layer on the SOI structure region on the semiconductor member by epitaxial growth and forming a polysilicon film on a surface of the LOCOS film, forming a recess for a support to support the silicon layer to be a part of the SOI structure, forming the support on the semiconductor member, exposing a side of the silicon germanium layer and the silicon layer underneath the support, forming a cavity by removing the silicon germanium layer having the side exposed, forming the SOI structure by embedding an insulating layer to be buried in the cavity, planarizing a covering insulating film formed to cover an entire of a top surface of the semiconductor member by using the polysilicon film as a stopper, and exposing a top surface of the silicon layer in the SOI structure by etching.

2 Claims, 15 Drawing Sheets

METHOD FOR MANUFACTURING A SEMICONDUCTOR SUBSTRATE, METHOD FOR MANUFACTURING A SEMICONDUCTOR DEVICE, AND THE SEMICONDUCTOR DEVICE

BACKGROUND

1. Technical Field

The present invention relates to a method for manufacturing a semiconductor substrate, a method for manufacturing a semiconductor device, and the semiconductor device. In particular, the invention relates to a technology to form a silicon-on-insulator (SOI) structure on a semiconductor substrate.

2. Related Art

Field effect transistors formed on an SOI structure have a huge benefit in which semiconductor devices having them can achieve low power consumption and high-speed operation. This is because the field effect transistors on the SOI structure have smaller junction capacitance, which is capacitance between a source-drain region and a substrate, compared with those formed on a bulk silicon wafer.

Accordingly, a semiconductor device that can include both a transistor on a bulk silicon wafer, which is capable of operating a load requiring large power consumption, and a transistor formed on an SOI structure has been known.

Further, as a method to isolate elements, a local oxidation of silicon (LOCOS) film is used.

In a common method thereof, an SOI substrate having an SOI structure formed on the entire surface of a bulk silicon wafer is prepared first, and then transistors are sequentially formed on the SOI structure. The SOI structure formed in an unwanted area is removed thereafter.

Further, a separation by bonding Si islands method capable of manufacturing an SOI transistor economically by partially forming an SOI structure on a bulk silicon wafer is disclosed.

In the method to partially form an SOI structure on a bulk silicon wafer, an insulating film such as a silicon oxide film is formed to cover the SOI structure to isolate the SOI structure from other portions. Then, the insulating film is planarized by chemical mechanical polishing (CMP). (e.g. T, Sakai et al., Second International SiGe Technology and Device Meeting, Meeting Abstract, pp. 230-231, May (2004)).

When a surface of a silicon layer is exposed by planarization using CMP, the surface of the silicon layer may be scratched due to variation in polished amounts.

Therefore, CMP is performed to leave a sufficient thickness of the insulating film to avoid scratching the silicon layer, then, wet etching needs to be performed. That is, the thick insulating film needs to be etched by wet etching after CMP.

When the thick insulating film is etched by wet etching, variation in wet etching amounts becomes large in proportion to an amount and time of wet etching, making the surface to be exposed uneven. Consequently, when the surface of the silicon layer is fully exposed by wet etching, corners of the silicon layer are widely exposed, causing occurrence of a parasitic MOS and deterioration of the reliability of the insulating film.

SUMMARY

An advantage of the invention is to provide a method for manufacturing a semiconductor substrate, a method for manufacturing a semiconductor device, and the semiconductor device, the semiconductor substrate and the semiconductor device having an SOI structure, reducing occurrence of a parasitic MOS and deterioration of the reliability of a gate insulating film.

According to an aspect of the invention, a method for manufacturing a semiconductor substrate having an SOI structure region isolated by a local oxidation of silicon (LOCOS) film and an SOI structure in the region includes forming the LOCOS film so as to make a height from an uppermost surface of a semiconductor member to a top surface of the LOCOS film be higher than a height from the uppermost surface of the semiconductor member to a top surface of the SOI structure, forming a silicon germanium layer and a silicon layer on the SOI structure region on the semiconductor member by epitaxial growth and forming a polysilicon film on a surface of the LOCOS film, forming a recess for a support to support the silicon layer to be a part of the SOI structure, forming the support on the semiconductor member, exposing a side of the silicon germanium layer and the silicon layer underneath the support, forming a cavity by removing the silicon germanium layer having the side exposed, forming the SOI structure by embedding an insulating layer to be buried in the cavity, planarizing a covering insulating film formed to cover an entire of a top surface of the semiconductor member by using the polysilicon film as a stopper, and exposing a top surface of the silicon layer in the SOI structure by etching.

Accordingly, since the film thickness of the LOCOS film is controllable, the height from the uppermost surface of the semiconductor member to the top surface of the LOCOS film is controlled to be higher than a height from the top surface of the semiconductor substrate to the top surface of the silicon layer of the SOI structure. Therefore, the polysilicon film formed on the top of the LOCOS film is used as a stopper for planarization. Then, the height of the LOCOS film can control an amount and time to etch the support on the silicon layer of the SOI structure, reducing fluctuation of wet etching. Accordingly, when the top surface of the silicon layer is exposed, corners of the silicon layer are prevented from being exposed. As a result, occurrence of a parasitic MOS and deterioration of the reliability of a gate insulating film are reduced.

According to the aspect of the invention, the method for manufacturing a semiconductor device may include forming a gate electrode on the covering insulating film of the SOI structure in the SOI structure region and a periphery thereof in addition to the method for manufacturing a semiconductor substrate.

The method for manufacturing a semiconductor device having the aforementioned effects is thus provided.

A semiconductor device according to another aspect of the invention includes a semiconductor member, a LOCOS film formed on the semiconductor member, an SOI structure region isolated by the LOCOS film, and an SOI structure formed on the SOI structure region, wherein a height from an uppermost surface of the semiconductor member to a top surface of the LOCOS film is higher than a height from the uppermost surface of the semiconductor member to a top surface of the SOI structure.

The semiconductor device having the aforementioned effects is thus provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the accompanying drawings.

First Embodiment

Figure 1A:
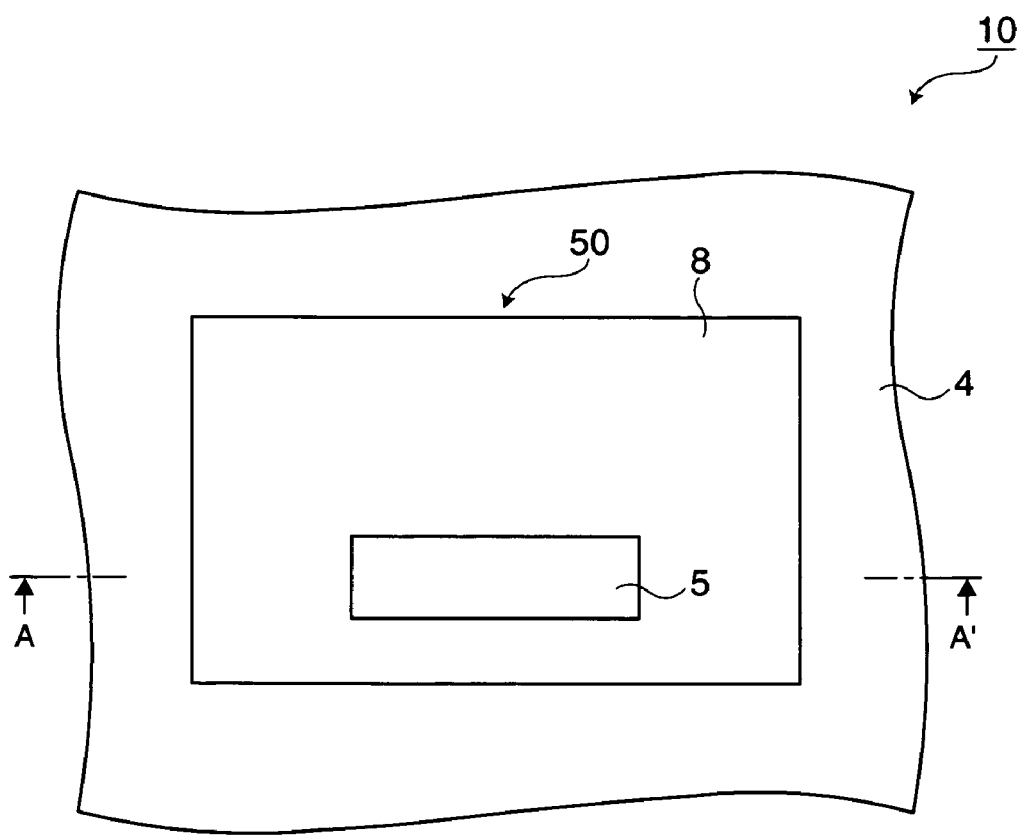
FIG. 1A is a plan view schematically showing a semiconductor substrate according to a first embodiment of the invention.
Figure 1B:
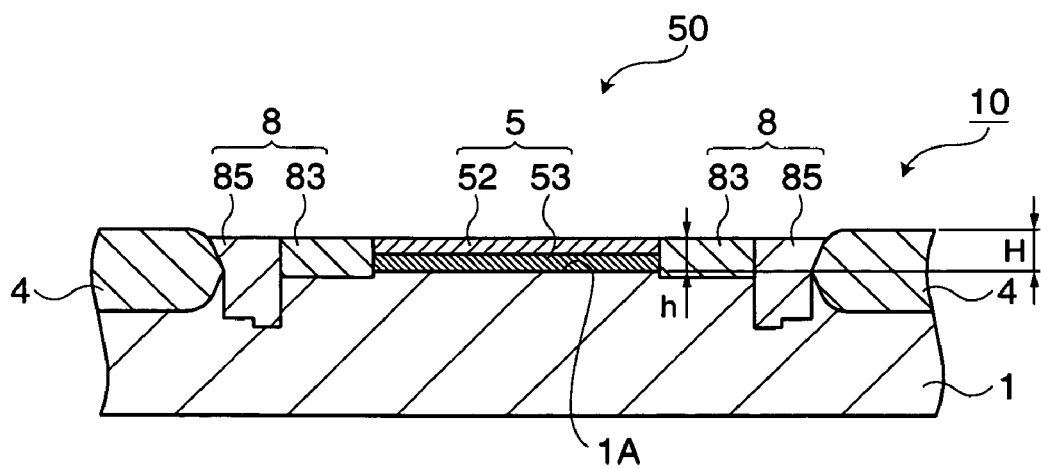
FIG. 1B is a sectional view taken along a line A to A' in FIG. 1A.

FIGS. 1A and 1B show a semiconductor substrate 10 according to a first embodiment.

FIG. 1A is a plan view schematically showing the semiconductor substrate 10 according to the embodiment while FIG. 1B is a schematic sectional view taken along a line A to A' in FIG. 1A.

In FIGS. 1A and 1B, the semiconductor substrate 10 includes an SOI structure 5, an SOI structure region 50, and a LOCOS film 4. The SOI structure 5 is made of a silicon layer 52 and a buried insulating layer 53, and formed on an uppermost surface 1A of a bulk silicon wafer 1 serving as a semiconductor member. The SOI structure region 50 includes an insulating film 8 composed of a portion left from a support 83 used at the time of forming the SOI structure 5 and a part of a covering insulating film 85 after planarization. The SOI structure region 50 is isolated from other regions on the bulk silicon wafer 1 by the LOCOS film 4.

Then, a height H from the uppermost surface 1A of the bulk silicon wafer 1 to a top surface of the LOCOS film 4 is formed higher than a height h from the uppermost surface 1A of the bulk silicon wafer 1 to a top surface of the silicon layer 52 in the SOI structure.

FIGS. 2A through 14B are schematic views showing a method for manufacturing the semiconductor substrate 10 according to the embodiment of the invention. Specifically, in FIGS. 2A through 14B, each figure suffixed with the letter A is a schematic plan view while each figure suffixed with the letter B is a schematic sectional view taken along the line A-A' in respective figures suffixed with the letter A.

The method for manufacturing the semiconductor substrate 10 of the embodiment includes a nitride film forming step, a LOCOS film forming step, an oxide film removing step, an epitaxial growth step, a recess forming step, a support-forming film forming step, a support forming step, a side exposing step, a cavity forming step, an SOI structure forming step, a planarizing step, a step of exposing a top surface of a silicon layer, and a polycrystalline film removing step.

Figure 2A:
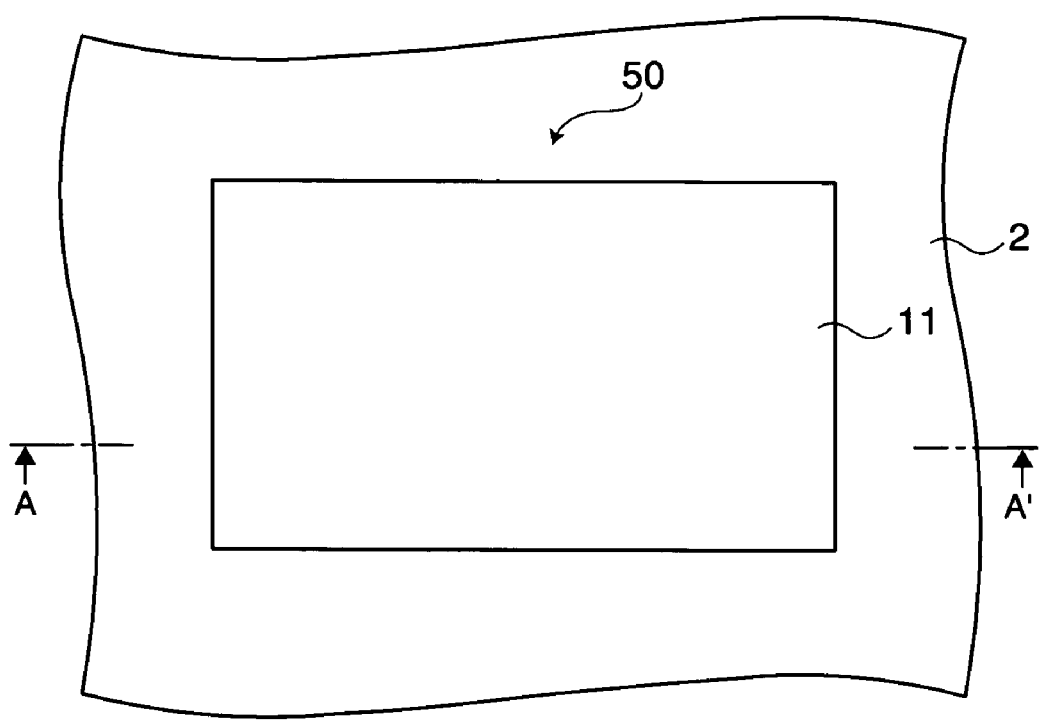
FIGS. 2A and 2B are schematic views showing a nitride film forming step in a method for manufacturing a semiconductor substrate.
Figure 2B:
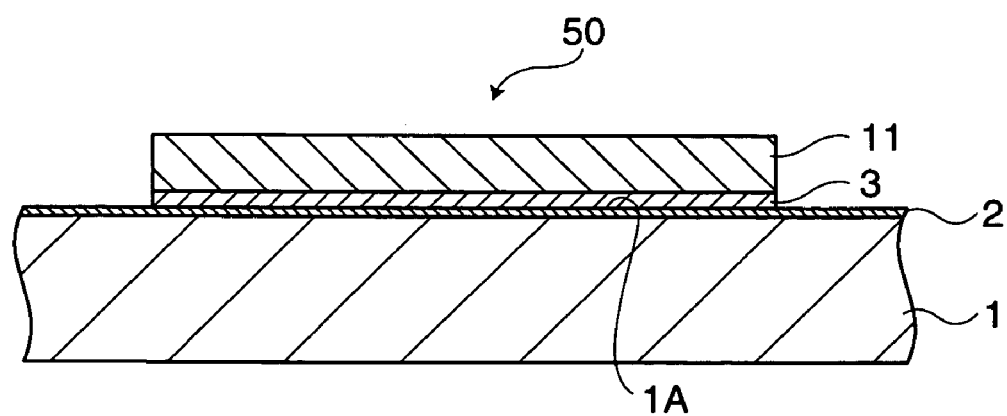
Figure 3A:
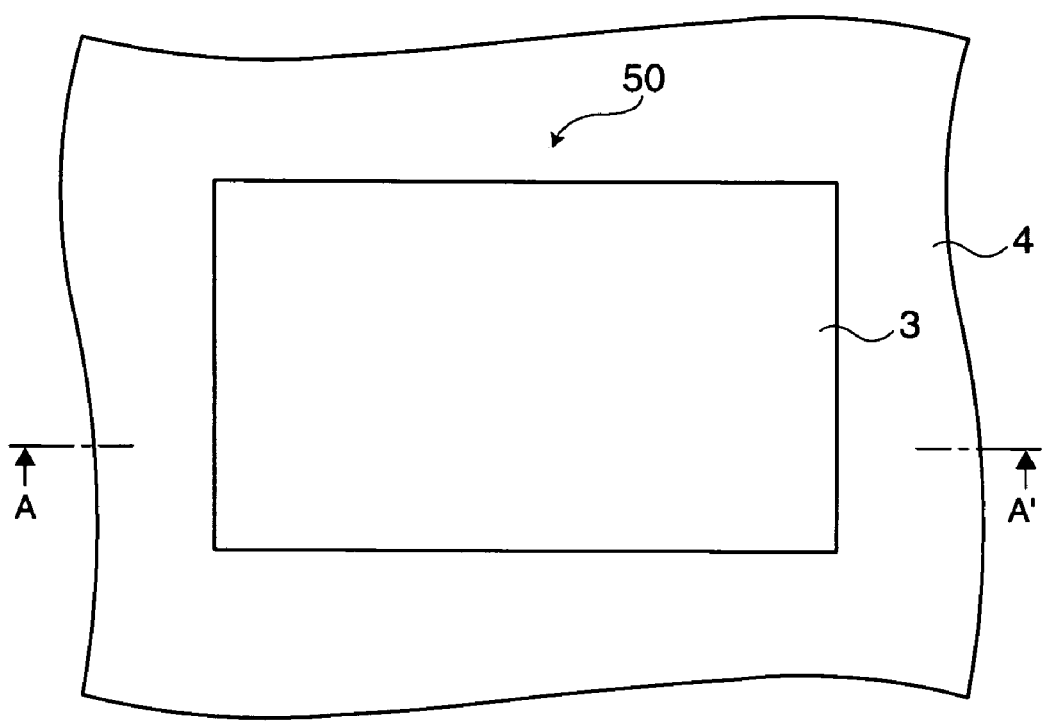
FIGS. 3A and 3B are schematic views showing a LOCOS film forming step in the method for manufacturing a semiconductor substrate.
Figure 3B:
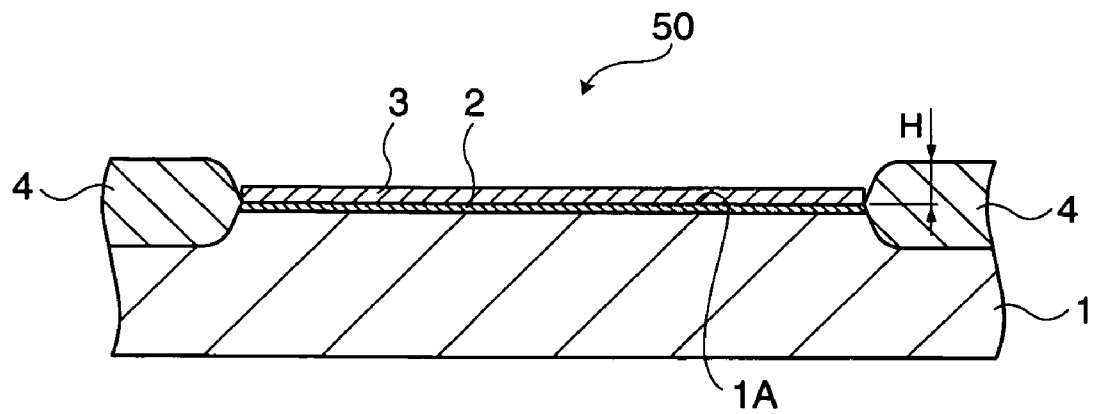
Figure 4A:
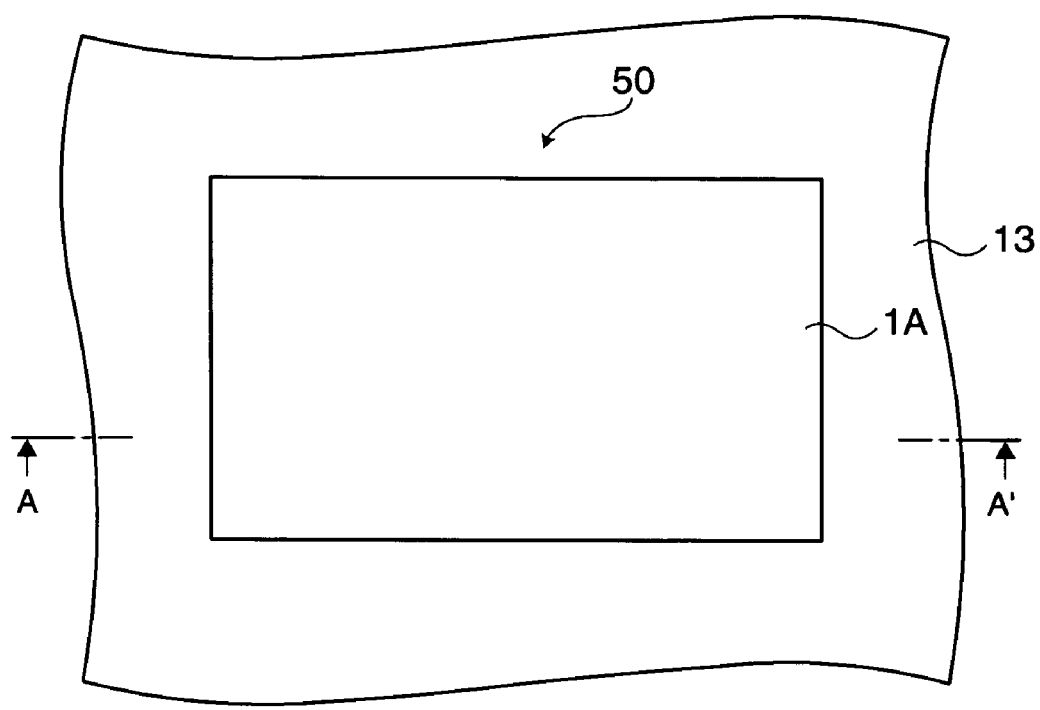
FIGS. 4A and 4B are schematic views showing an oxide film removing step in the method for manufacturing a semiconductor substrate.
Figure 4B:
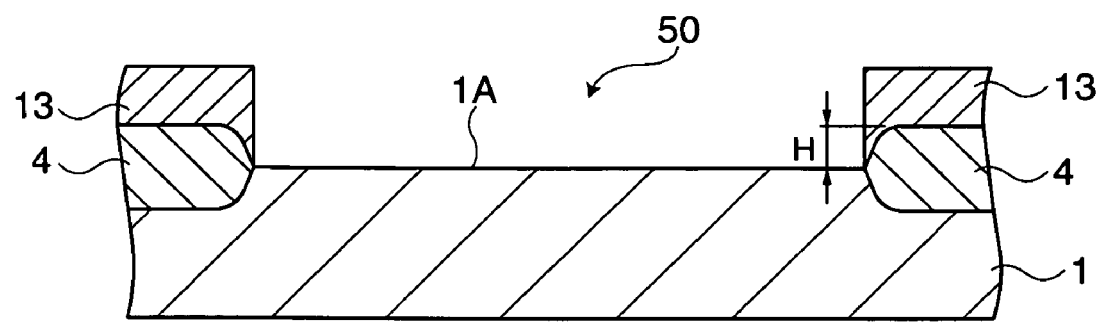
Figure 5A:
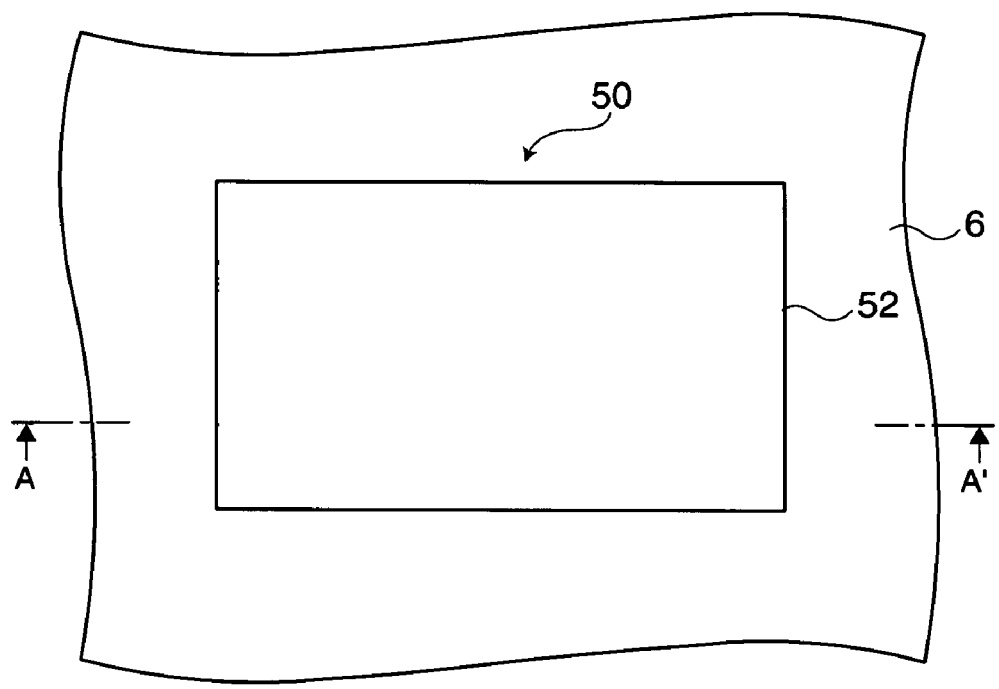
FIGS. 5A and 5B are schematic views showing an epitaxial growth step in the method for manufacturing a semiconductor substrate.
Figure 5B:
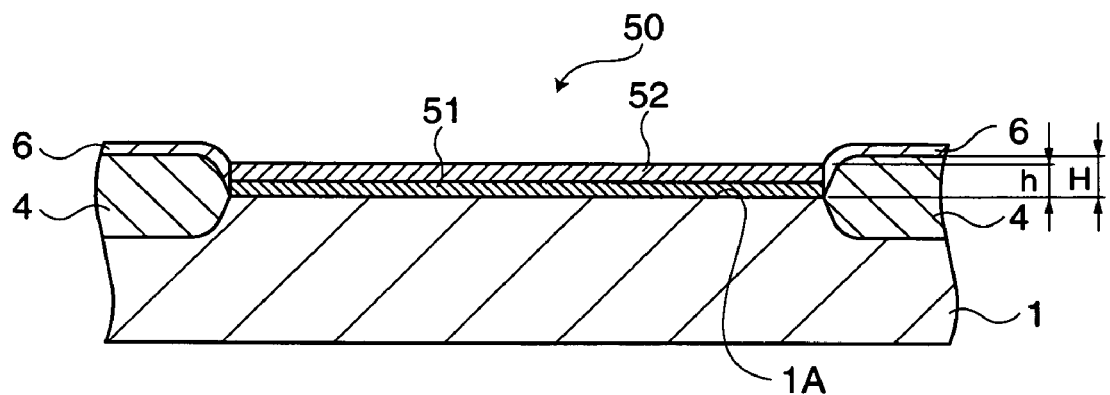
Figure 6A:
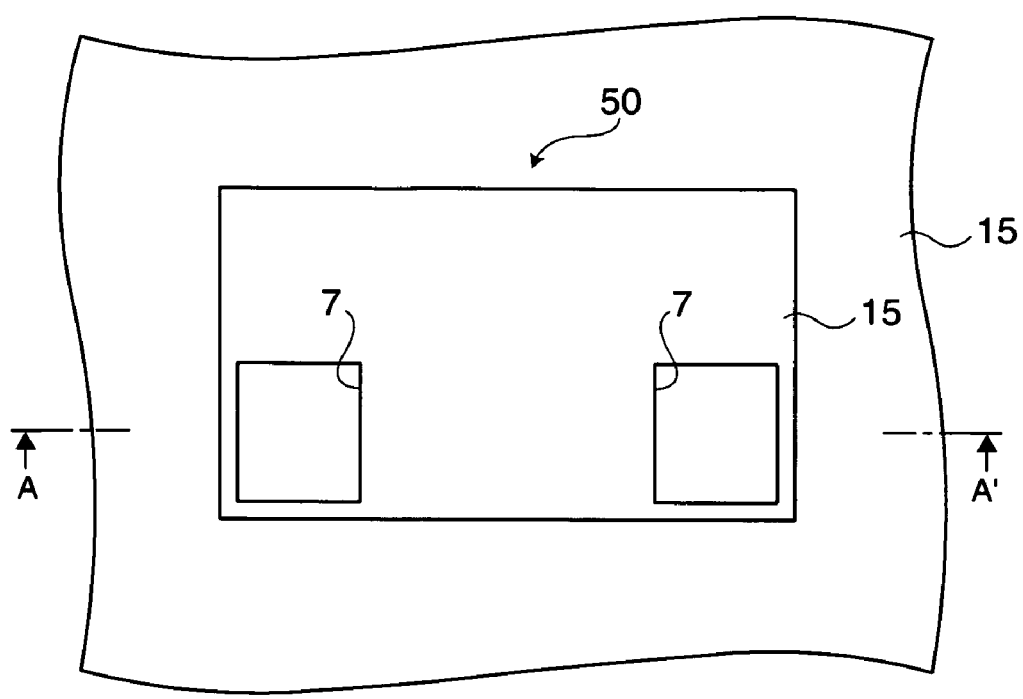
FIGS. 6A and 6B are schematic views showing a recess forming step in the method for manufacturing a semiconductor substrate.
Figure 6B:
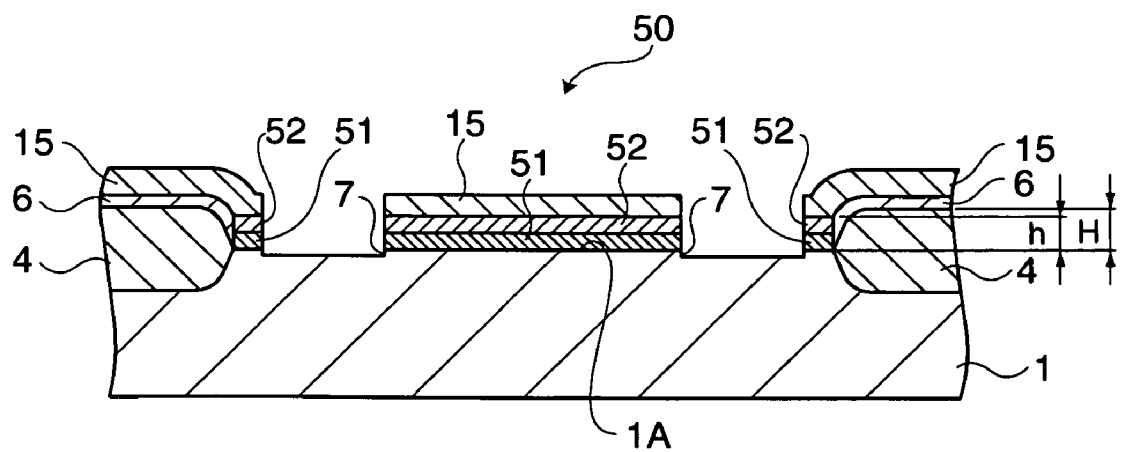
Figure 7A:
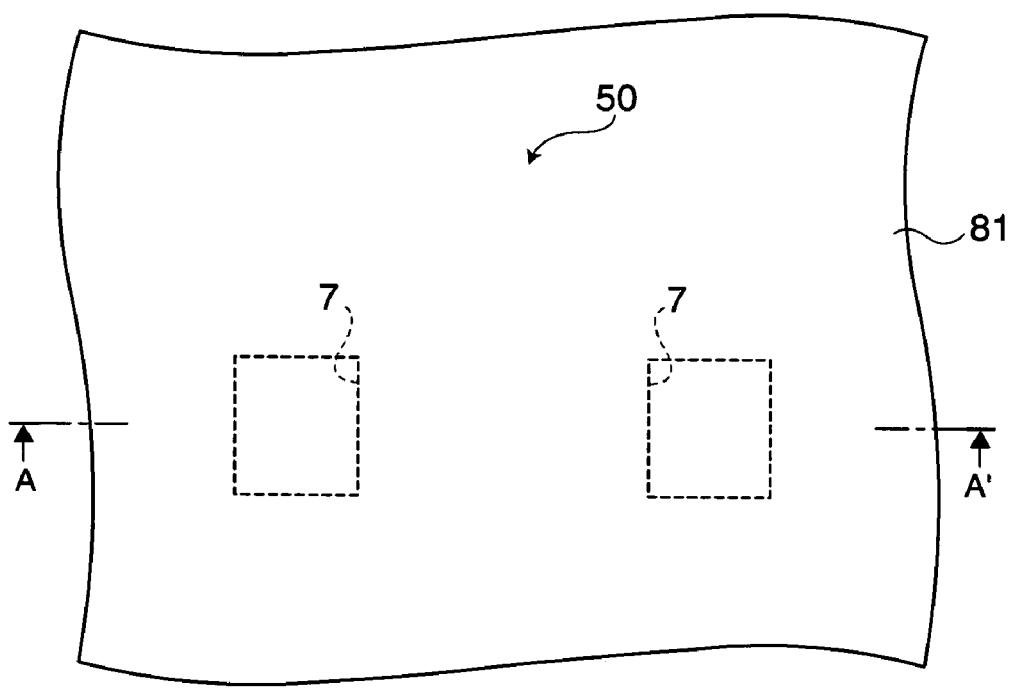
FIGS. 7A and 7B are schematic views showing a support-forming film forming step in the method for manufacturing a semiconductor substrate.
Figure 7B:
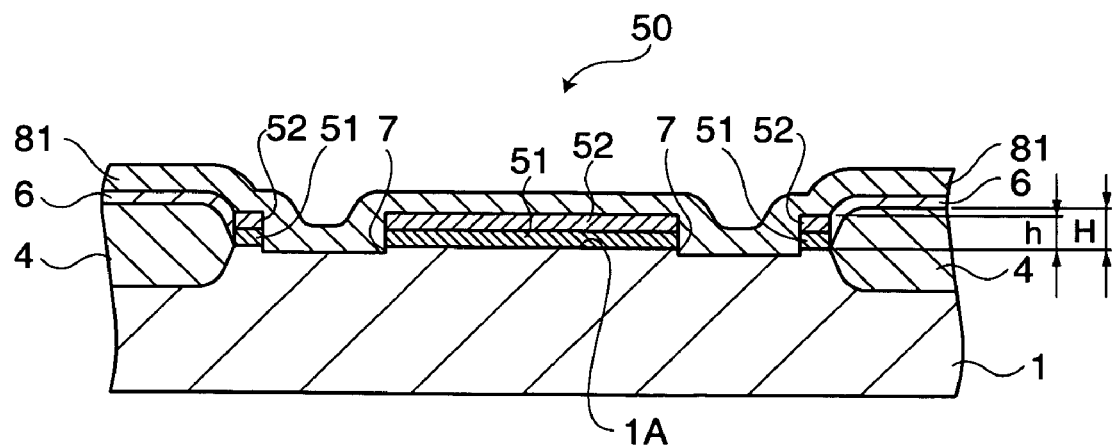
Figure 8A:
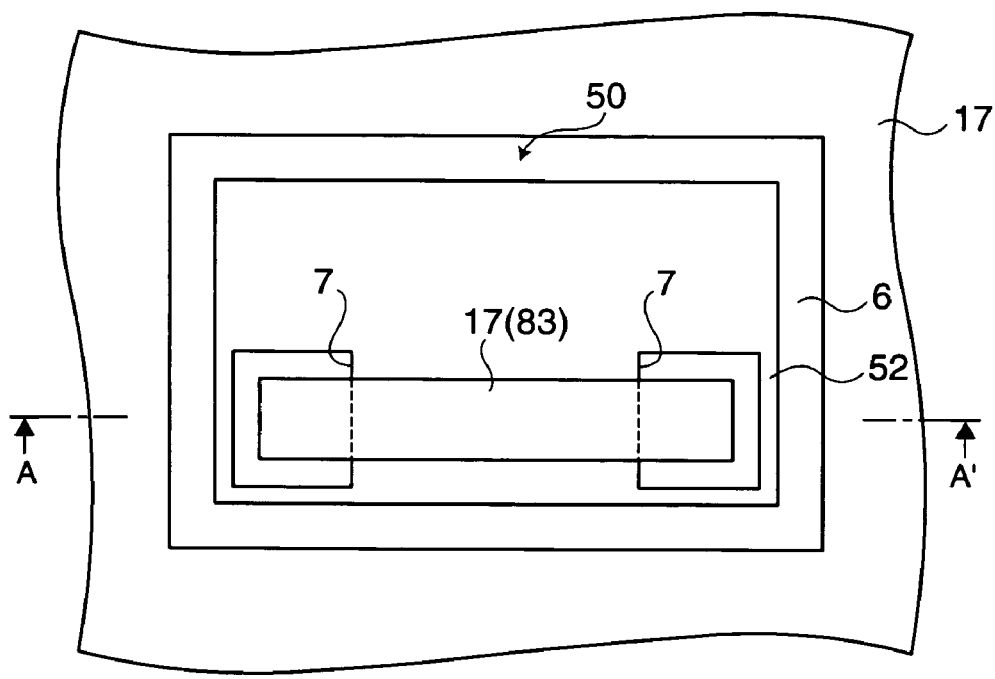
FIGS. 8A and 8B are schematic views showing a support forming step in the method for manufacturing a semiconductor substrate.
Figure 8B:
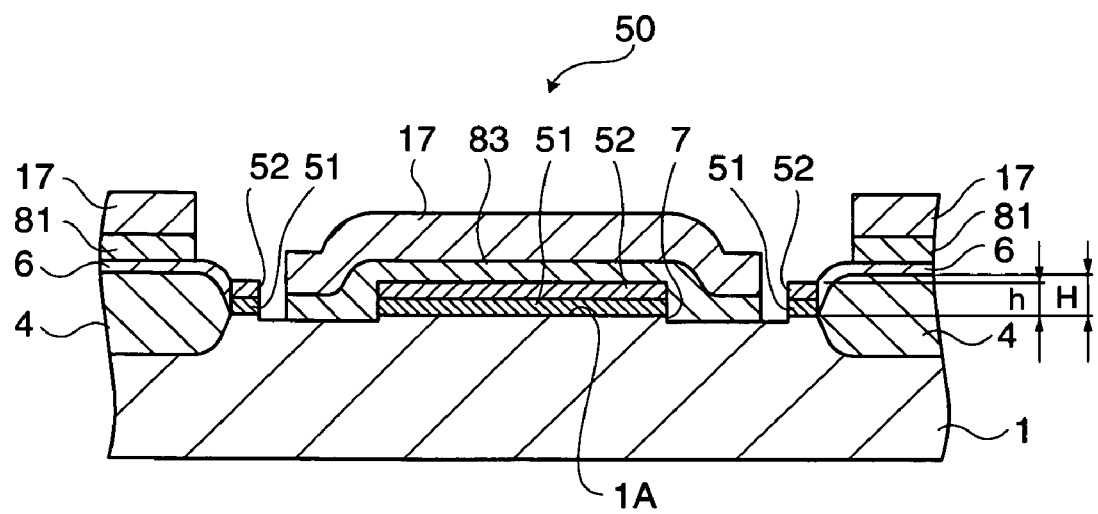
Figure 9A:
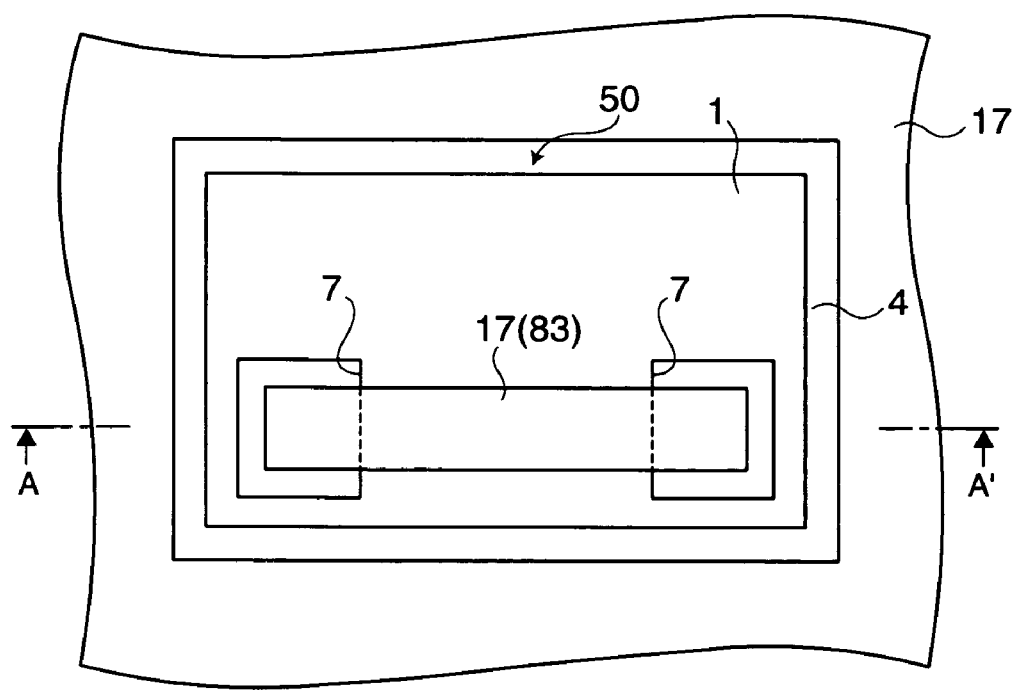
FIGS. 9A and 9B are schematic views showing a side exposing step in the method for manufacturing a semiconductor substrate.
Figure 9B:
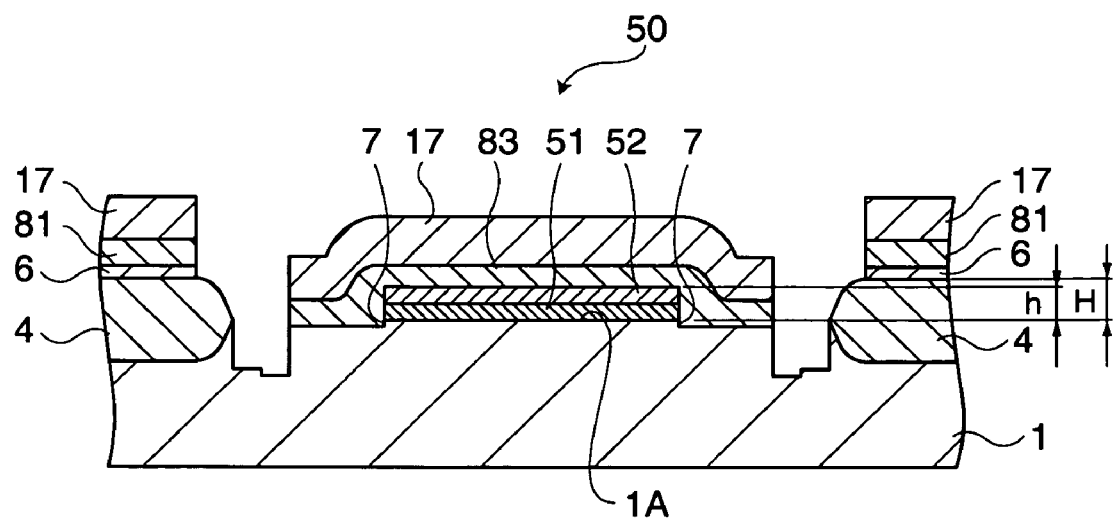
Figure 10A:
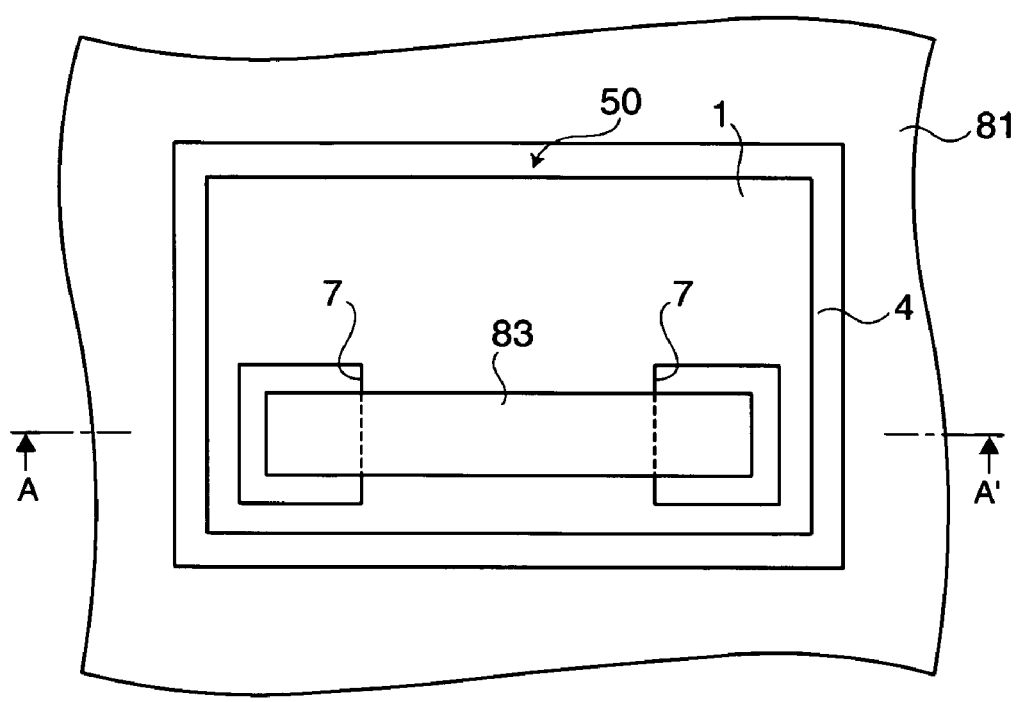
FIGS. 10A and 10B are schematic views showing a cavity forming step in the method for manufacturing a semiconductor substrate.
Figure 10B:
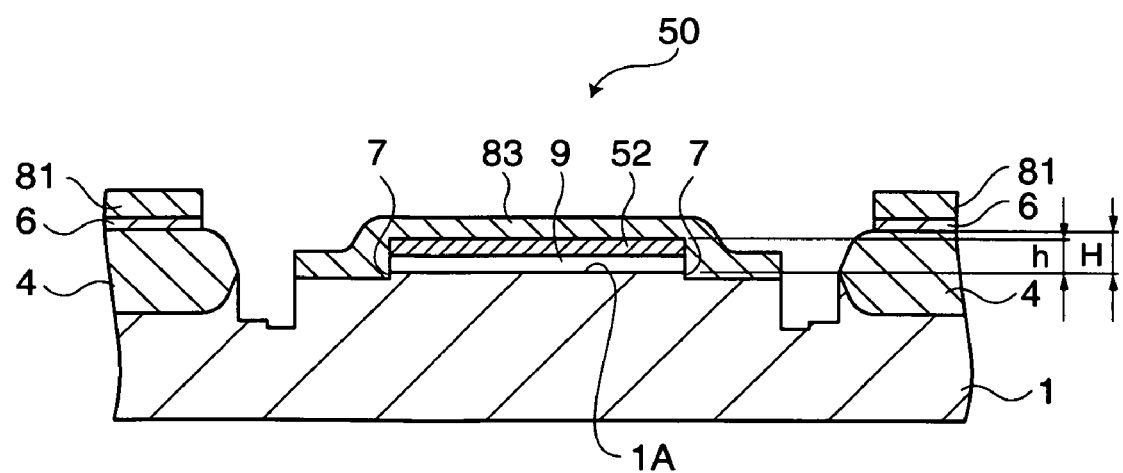
Figure 11A:
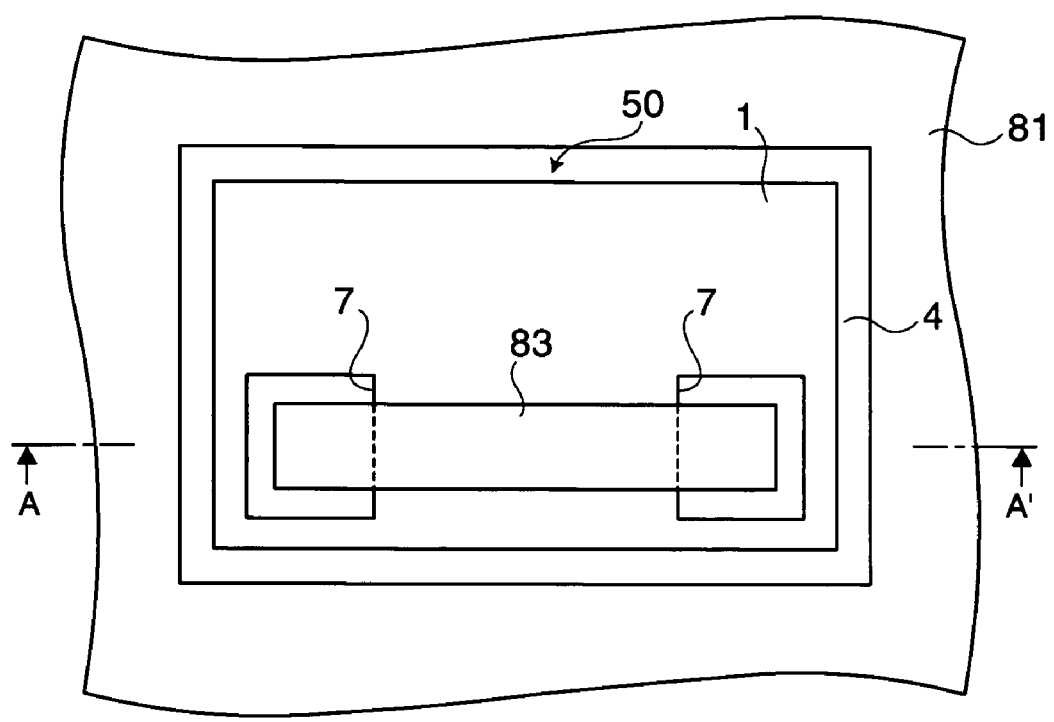
FIGS. 11A and 11B are schematic views showing an SOI structure forming step in the method for manufacturing a semiconductor substrate.
Figure 11B:
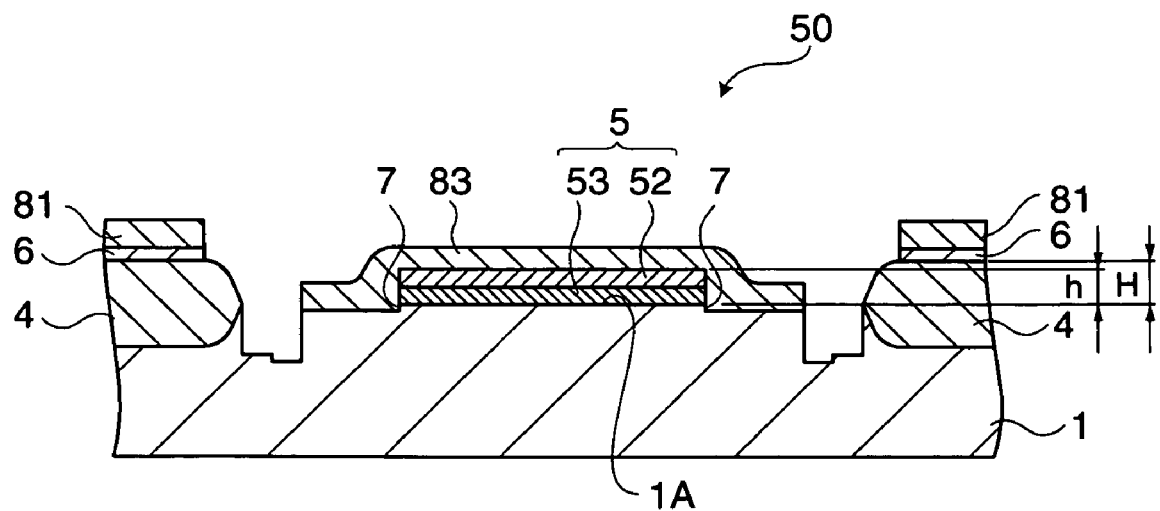
Figure 12A:
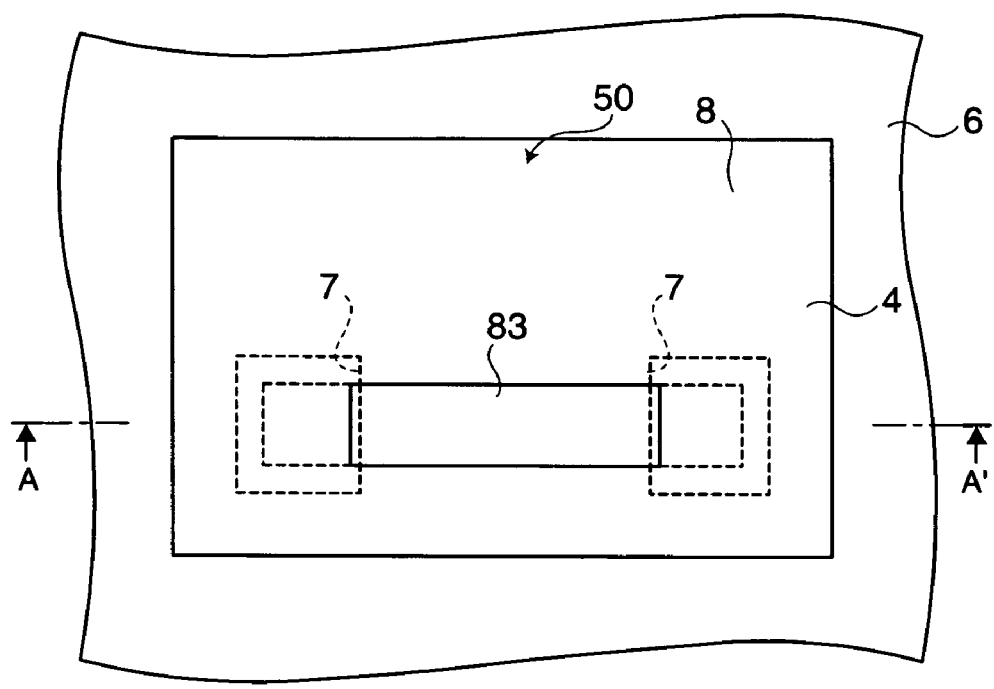
FIGS. 12A and 12B are schematic views showing a planarizing step in the method for manufacturing a semiconductor substrate.
Figure 12B:
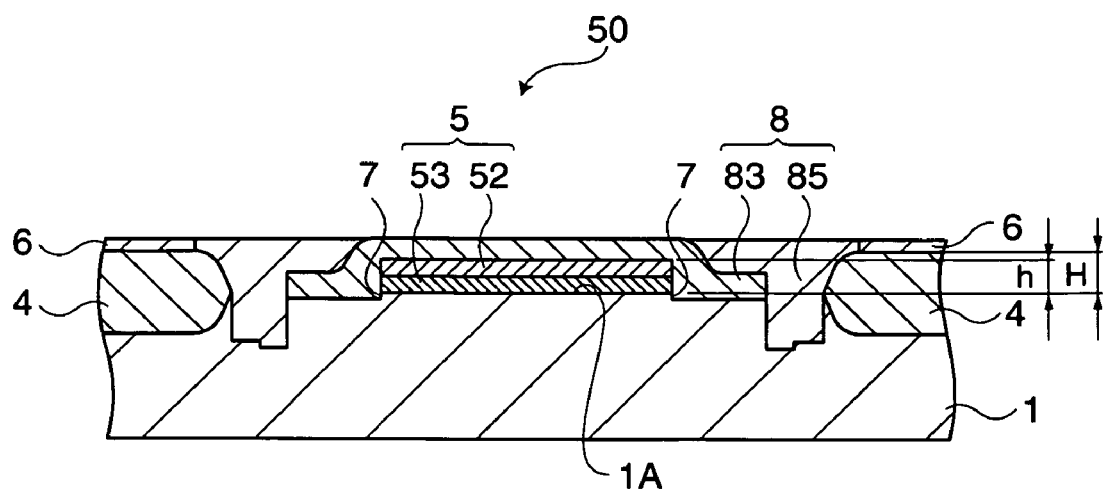
Figure 13A:
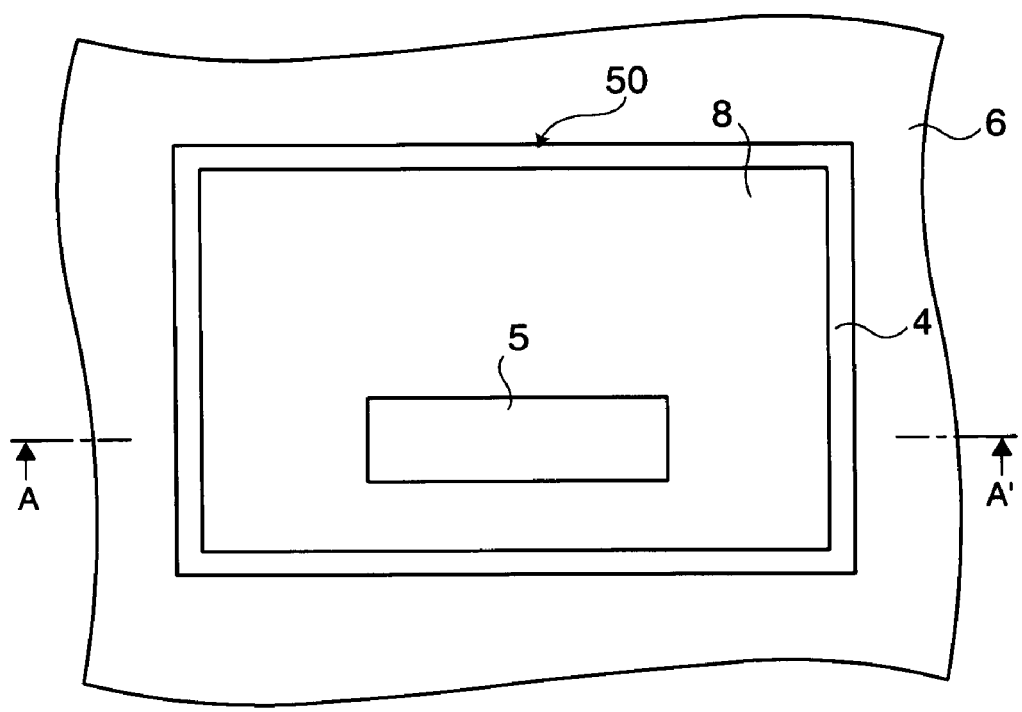
FIGS. 13A and 13B are schematic views showing a step of exposing a top surface of a silicon layer in the method for manufacturing a semiconductor substrate.
Figure 13B:
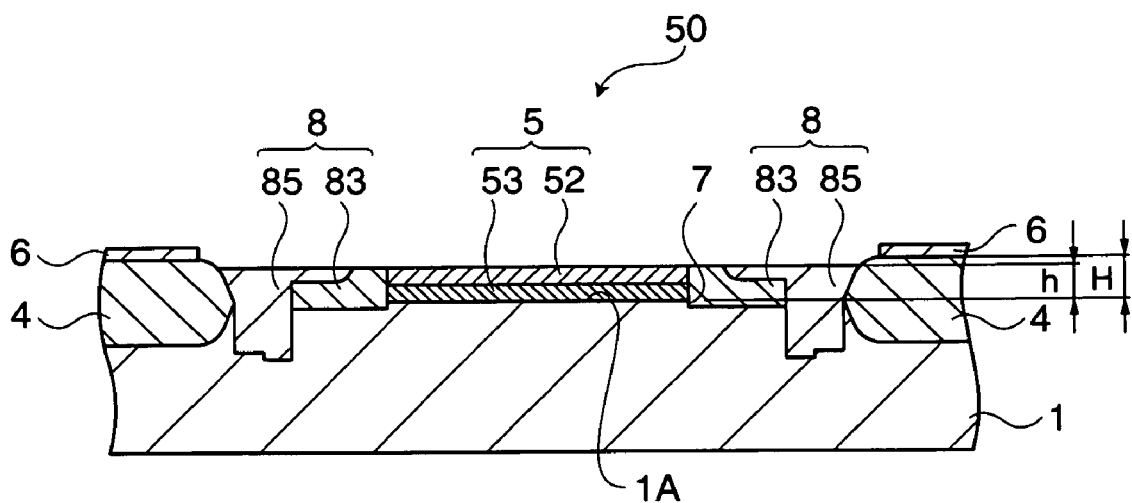
Figure 14A:
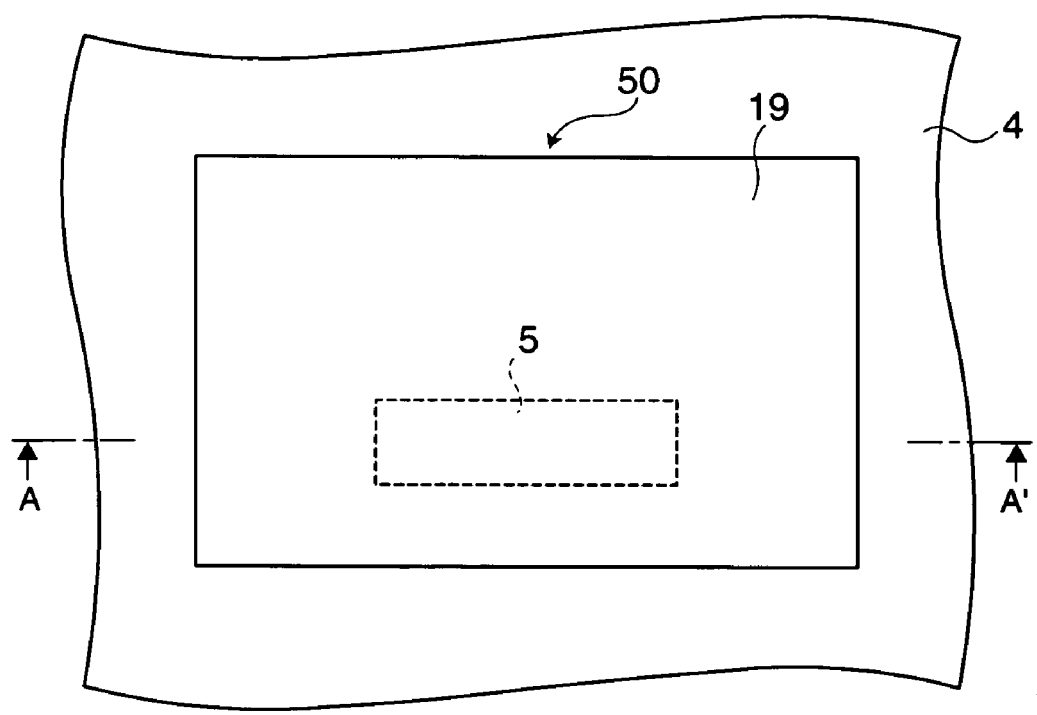
FIGS. 14A and 14B are schematic views showing a polycrystalline film removing step in the method for manufacturing a semiconductor substrate.
Figure 14B:
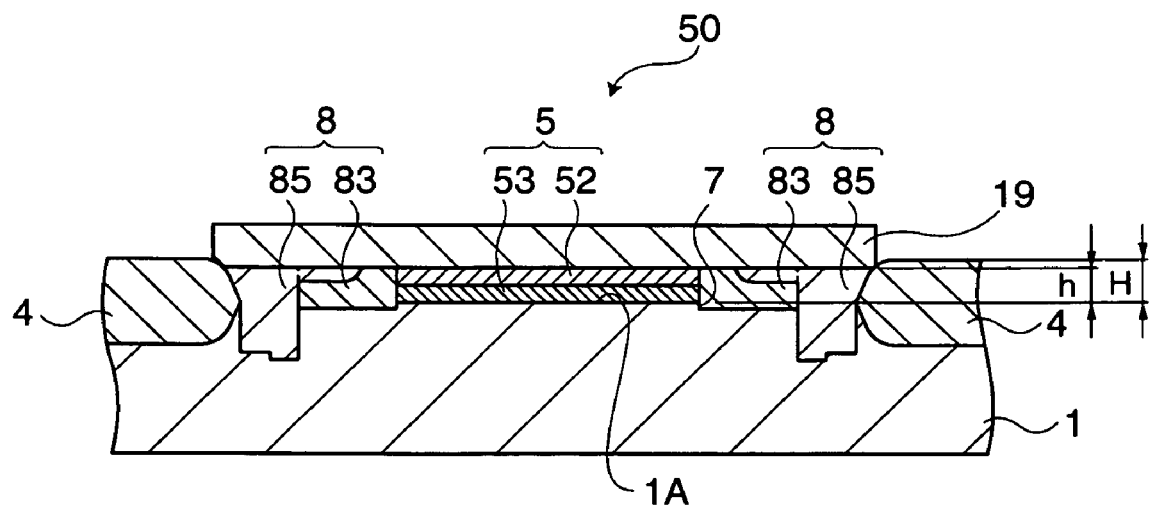

FIGS. 2A and 2B show the nitride film forming step, FIGS. 3A and 3B show the LOCOS film forming step, FIGS. 4A and 4B show the oxide film removing step, FIGS. 5A and 5B show the epitaxial growth step, FIGS. 6A and 6B show the recess forming step, FIGS. 7A and 7B show the support-forming film forming step, FIGS. 8A and 8B show the support forming step, FIGS. 9A and 9B show the side exposing step, FIGS. 10A and 10B show the cavity forming step, FIGS. 11A and 11B show the SOI structure forming step, FIGS. 12A and 12B show the planarizing step, FIGS. 13A and 13B show the step of exposing a top surface of a silicon layer, and FIGS. 14A and 14B show the polycrystalline film removing step.

The steps for manufacturing the semiconductor substrate 10 according to the embodiment are described below.

FIGS. 2A and 2B show the nitride film forming step to form a silicon oxide film 2 on the bulk silicon wafer 1 and form a silicon nitride film 3 in the SOI structure region 50.

The silicon oxide film 2 is formed on the uppermost surface 1A of the bulk silicon wafer 1. Then, the silicon nitride film 3 is formed on an entire surface of the silicon oxide film 2.

As shown in FIGS. 2A and 2B, a resist applied and cured on the bulk silicon wafer 1 by photolithography is etched, forming a photoresist film 11 in the SOI structure region 50. Subsequently, a part of the silicon nitride film 3 located on which the photoresist film is not formed is removed by dry etching using the photoresist film 11 as a mask. Then, the photoresist film 11 is removed.

FIGS. 3A and 3B show the LOCOS film forming step to form the LOCOS film 4.

As shown in FIGS. 3A and 3B, a part of the silicon oxide film 2 located on which the silicon nitride film 3 is not formed is grown by thermal oxidation so as to form the LOCOS film 4.

The LOCOS film 4 will not be formed on which the silicon nitride film 3 is formed since the silicon nitride film 3 has a property not to let oxygen through. Further, since the film thickness of the LOCOS film 4 is controllable, a height H up to a top surface of the LOCOS film 4 is also controllable.

Here, as shown in FIGS. 1A and 1B, the height H from the uppermost surface 1A of the bulk silicon wafer 1 to the top surface of the LOCOS film 4 is preliminarily formed higher than the height h up to the top surface of the silicon layer 52.

FIGS. 4A and 4B show the oxide film removing step to remove the silicon oxide film 2 and the silicon nitride film 3.

First, the silicon nitride film 3 is removed by wet etching using an etchant such as heated phosphoric acid.

Now, a resist applied and cured on the silicon oxide film 2 and the LOCOS film 4 by photolithography is etched, forming a photoresist film 13 in which the resist in a part corresponding to a shape of the SOI structure region 50 is removed as shown in FIGS. 4A and 4B.

Then, the silicon oxide film 2 exposed from the photoresist film 13 is removed by wet etching using an etchant such as hydrofluoric acid. The uppermost surface 1A is thus exposed. Then, the photoresist film 13 is removed.

FIGS. 5A and 5B show the epitaxial growth step to form the silicon germanium layer 51 and the silicon layer 52 on the uppermost surface 1A of the bulk silicon wafer 1 by epitaxial growth.

As shown in FIGS. 5A and 5B, the silicon germanium layer 51 having a crystal structure is formed on the uppermost surface 1A, and then the silicon layer 52 having a crystal structure is formed thereon. At this time, the LOCOS film 4 not having a crystal structure has a polysilicon film 6 formed on the surface thereof.

Here, the height h from the uppermost surface 1A of the bulk silicon wafer 1 to the top surface of the silicon layer 52 is formed lower than the height H up to the top surface of the LOCOS film 4.

FIGS. 6A and 6B show the recess forming step to form recesses 7 for the support 83 to support the silicon layer 52 for the SOI structure 5.

A resist applied and cured on the surfaces of the silicon layer 52 and the polysilicon film 6 by photolithography is etched, forming a photoresist film 15 in which the resist in portions corresponding to shapes of the recesses 7 are removed as shown in FIGS. 6A and 6B.

Then, the silicon layer 52 and the silicon germanium layer 51 are partially removed by dry etching. The uppermost surface 1A of the bulk silicon wafer 1 is partially exposed, forming the recesses 7.

In FIGS. 6A and 6B, further dry etching in order to fully expose the uppermost surface 1A removes some of the bulk silicon wafer 1, forming the recesses 7. Then, the photoresist film 15 is removed.

FIGS. 7A and 7B show the support-forming film forming step to form a support-forming film 81 to support the silicon layer 52 on the bulk silicon wafer 1.

As shown in FIGS. 7A and 7B, the support-forming film 81 such as a silicon oxide film is formed so as to cover the surfaces of the silicon layer 52, the silicon germanium layer 51, the polysilicon film 6, and the recesses 7.

FIGS. 8A and 8B show the support forming step to form the support 83 to support the top surface of the silicon layer 52.

A resist applied and cured on the surfaces of the silicon layer 52, the silicon germanium layer 51, the polysilicon film 6 and the recesses 7 by photolithography is etched, forming a photoresist film 17 in which a part where the support 83 will be formed is covered but the resist in the SOI structure region around the part where the support 83 will be formed and its periphery is removed as shown in FIGS. 8A and 8B.

Then, the support-forming film 81 is partially removed by dry etching. The support 83 to support the silicon layer 52 is thus formed on the top surfaces of the recesses 7 and the silicon layer 52.

FIGS. 9A and 9B show the side exposing step to expose sides of the silicon germanium layer 51 and the silicon layer 52 positioned underneath the support 83.

The silicon layer 52 and the silicon germanium layer 51 are removed by further dry etching as shown in FIGS. 9A and 9B. At this time, the polysilicon film 6 on the LOCOS film 4 is partially removed.

The sides of the silicon germanium layer 51 and the silicon layer 52 formed between the bulk silicon wafer 1 and the support 83 are thus exposed.

At this time, if two sides of the silicon germanium layer 51 formed underneath the support 83, which are the sides of the silicon germanium layer 51 positioned in front and rear in FIG. 9B, for example, are not sufficiently exposed, further dry etching is required. According to this, some of the bulk silicon wafer 1 can be removed as shown in FIGS. 9A and 9B. Then, the photoresist film 17 is removed.

FIGS. 10A and 10B show the cavity forming step to form a cavity 9 by removing the silicon germanium layer 51 underneath the support 83.

The silicon germanium layer 51 is selectively removed by wet etching using an etchant such as hydrofluoric-nitric acid so as to form the cavity 9 between the bulk silicon wafer 1 and the silicon layer 52 supported by the support 83 as shown in FIGS. 10A and 10B.

FIGS. 11A and 11B show the SOI structure forming step to form the buried insulating layer 53 in the cavity 9, which will be a part of the SOI structure 5.

The buried insulating layer 53 made of a silicon oxide film or the like is formed between the bulk silicon wafer 1 and the silicon layer 52 supported by the support 83 by thermal oxidation as shown in FIGS. 11A and 11B. Namely, the SOI structure 5 made of the silicon layer 52 and the buried insulating layer 53 is formed between the bulk silicon wafer 1 and the support 83.

FIGS. 12A and 12B show the planarizing step to planarize the covering insulating film 85 using the polysilicon film 6 on the LOCOS film 4 as a stopper.

The covering insulating film such as a silicon oxide film is formed on an entire of the top surface of the bulk silicon wafer 1 so as to cover a plurality of exposed sides of the SOI structure 5. As shown in FIGS. 12A and 12B, planarization is performed by CMP as far as that a top surface of the polysilicon film 6 used as a stopper is exposed. Accordingly, the support-forming film 81 on the polysilicon film 6 is removed. However, the covering insulating film 85 after planarization is partially formed.

Some of the top surface of the support 83 and the polysilicon film 6 can be removed.

Since the height H is higher than the height h, even after the polysilicon film 6 used as a stopper is removed, the silicon layer 52 is neither exposed nor scratched.

FIGS. 13A and 13B show the step of exposing a top surface of a silicon layer to expose the top surface of the silicon layer 52 by etching.

As shown in FIGS. 13A and 13B, wet etching using an etchant such as dilute hydrofluoric acid is performed to reach the top surface of the SOI structure 5. Since the insulating film 8 left here is very thin, an amount to be etched by wet etching becomes small and the time becomes short.

FIGS. 14A and 14B show the polycrystalline film removing step to remove the polysilicon film 6 on the LOCOS film 4.

A resist applied and cured on the bulk silicon wafer 1 by photolithography is etched, forming a photoresist film 19 covering the SOI structure region 50 and its periphery as shown in FIGS. 14A and 14B.

Next, the polysilicon film 6 on the LOCOS film 4 is removed by dry etching. Then, the photoresist film 19 is removed.

Consequently, the semiconductor substrate 10 having the top surface of the silicon layer 52 of the SOI structure 5 exposed is completed as shown in FIGS. 1A and 1B.

Now, advantageous effects of the first embodiment are described below.

As the film thickness of the LOCOS film 4 is controllable, the height H from the uppermost surface 1A of the bulk silicon wafer 1 to the top surface of the LOCOS film 4 is preliminarily formed higher than the height h from the uppermost surface 1A to the top surface of the silicon layer 52 of the SOI structure 5. Accordingly, a polysilicon film formed on the top of the LOCOS film 4 is used as a stopper for planarization. Therefore, the height H can control an amount and time to etch a support on a silicon layer of an SOI structure, reducing fluctuation of wet etching. Accordingly, when the top surface of the silicon layer 52 is exposed, corners of the silicon layer 52 are prevented from being exposed. As a result, occurrence of a parasitic MOS and deterioration of the reliability of a gate insulating film are reduced.

Second Embodiment

Next, a method for manufacturing a semiconductor device according to a second embodiment of the invention will be described.

Figure 15A:
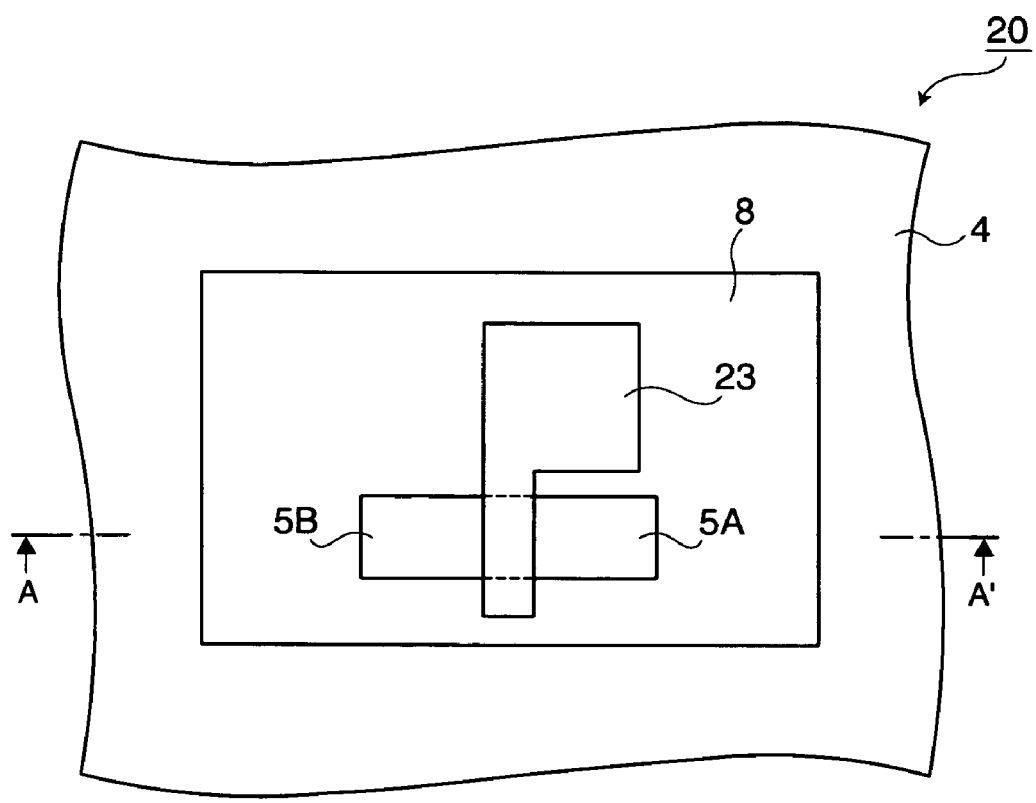
FIG. 15A is a plan view schematically showing a semiconductor device according to a second embodiment of the invention.
Figure 15B:
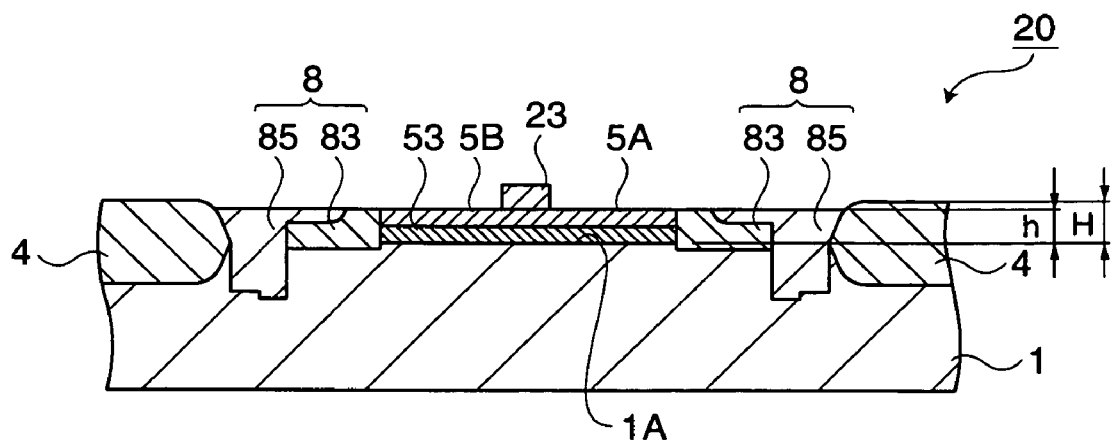
FIG. 15B is a sectional view taken along a line A to A' in FIG. 15A.

FIGS. 15A and 15B show a semiconductor device 20 according to the second embodiment.

FIG. 15A is a schematic plan view while FIG. 15B is a schematic sectional view taken along the line A-A' in FIG. 15A.

FIGS. 15A and 15B are schematic views showing a method for manufacturing the semiconductor device 20 according to the second embodiment of the invention.

The method for manufacturing the semiconductor device 20 includes forming a gate electrode 23 shown in FIGS. 15A and 15B following the method for manufacturing a semiconductor substrate described in FIG. 1A through 14B.

A gate insulating film that is not shown is formed on the surface of the silicon layer 52 by thermal oxidation. Then, a polysilicon film is formed on the gate insulating film by a method such as chemical vapor deposition. The polysilicon film is patterned by photolithography, forming the gate electrode 23 as shown in FIGS. 15A and 15B.

Next, ions of an impurity such as arsenic (As), phosphorus (P), or boron (B) are implanted into the silicon layer 52 by using the gate electrode 23 as a mask, forming a source region 5A and a drain region 5B that are made of impurity introduction layers on the both sides of the gate electrode 23 in the silicon layer 52. The semiconductor device 20 having the SOI structure 5 is thus completed.

According to the semiconductor device 20 of the second embodiment, the following effects are obtained.

The method for manufacturing the semiconductor device 20 having the abovementioned advantages is provided and the reliability of the semiconductor device 20 is improved.

It is to be noted that this invention is not limited to the aforementioned embodiments but includes various modifications or improvements within a scope of a purpose of this invention.

For example, when the height H is limited due to specification of a transistor mixedly mounted on the bulk silicon wafer 1 and cannot be made higher than the height h, the uppermost surface 1A of the bulk silicon wafer 1 can be preliminarily etched so that the SOI structure 5 is formed in a position lower than the uppermost surface 1A to make the height H relatively higher.

Further, although the preferred embodiments of the invention are disclosed as above, the invention is not limited thereto. That is, the invention is described mainly according to the specific embodiments. However, those skilled in the art can add various modifications to the materials to be used, the methods and other details in the embodiments described above without departing from the scope and spirit of the invention.

Therefore, the descriptions to limit the materials and the methods disclosed above are examples to facilitate understanding of the invention, not to limit to the invention. The invention thus includes the descriptions of the materials and the methods without limitations in a part or a whole thereof.

What is claimed is:

1. A method for manufacturing a semiconductor substrate having a silicon-on-insulator (SOI) structure region isolated by a local oxidation of silicon (LOCOS) film and an SOI structure in the region, comprising:

forming the LOCOS film so as to make a height from an uppermost surface of a semiconductor member to a top surface of the LOCOS film be higher than a height from the uppermost surface of the semiconductor member to a top surface of the SOI structure;

forming a silicon germanium layer and a silicon layer on the SOI structure region on the semiconductor member by epitaxial growth and forming a polysilicon film on a surface of the LOCOS film;

forming a recess for a support to support the silicon layer to be a part of the SOI structure;

forming the support on the semiconductor member;

exposing a side of the silicon germanium layer and the silicon layer underneath the support;

forming a cavity by removing the silicon germanium layer having the side exposed;

forming the SOI structure by embedding an insulating layer to be buried in the cavity;

planarizing a covering insulating film formed to cover an entire of a top surface of the semiconductor member by using the polysilicon film as a stopper; and exposing a top surface of the silicon layer in the SOI structure by etching.

2. The method for manufacturing a semiconductor device, comprising forming a gate electrode on the covering insulating film of the SOI structure in the SOI structure region and a periphery thereof in addition to the method for manufacturing a semiconductor substrate according to claim 1.

* * * * *